United States Patent
Kim (10) Patent No.: US 10,158,327 B2
(45) Date of Patent: Dec. 18, 2018

(54) LOW IMPEDANCE ADAPTIVE BIAS SCHEME FOR POWER AMPLIFIER

(71) Applicant: QUALCOMM Incorporated, San Diego, CA (US)

(72) Inventor: Woonyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/473,516

(22) Filed: Mar. 29, 2017

(65) Prior Publication Data

US 2018/0123517 A1    May 3, 2018

Related U.S. Application Data

(60) Provisional application No. 62/456,958, filed on Feb. 9, 2017, provisional application No. 62/414,580, filed on Oct. 28, 2016.

(51) Int. Cl.
| | |
|---|---|
| H03F 1/02 | (2006.01) |
| H03F 3/195 | (2006.01) |
| H03F 3/24 | (2006.01) |
| H03F 3/50 | (2006.01) |
| H04B 1/04 | (2006.01) |
| H03F 3/19 | (2006.01) |
| H04B 1/38 | (2015.01) |

(52) U.S. Cl.
CPC ......... *H03F 1/0205* (2013.01); *H03F 1/0266* (2013.01); *H03F 3/19* (2013.01); *H03F 3/195* (2013.01); *H03F 3/245* (2013.01); *H03F 3/50* (2013.01); *H04B 1/04* (2013.01); *H03F 2200/111* (2013.01); *H03F 2200/18* (2013.01); *H03F 2200/451* (2013.01); *H04B 1/38* (2013.01); *H04B 2001/0408* (2013.01)

(58) Field of Classification Search
USPC .................. 330/296, 288, 289, 285
See application file for complete search history.

(56) References Cited

U.S. PATENT DOCUMENTS

| | | | |
|---|---|---|---|
| 6,750,721 B2 * | 6/2004 | Patterson | H03F 1/302 330/285 |
| 6,922,107 B1 * | 7/2005 | Green | H03F 1/302 330/285 |

(Continued)

FOREIGN PATENT DOCUMENTS

EP    1359665 A2    11/2003

OTHER PUBLICATIONS

International Search Report and Written Opinion—PCT/US2017/054552—ISA/EPO—dated Dec. 22, 2017.

(Continued)

*Primary Examiner* — Hieu Nguyen
(74) *Attorney, Agent, or Firm* — Qualcomm Incorporated/Seyfarth Shaw LLP; Alan M. Lenkin (57) ABSTRACT

An adaptive bias circuit for a power amplifier may include a terminal node coupled to the power amplifier. The adaptive bias circuit may also include a low impedance bias circuit coupled to the terminal node. The adaptive bias circuit may further include a high drive bias circuit coupled to the low impedance bias circuit through the terminal node. A separation device may be arranged between the low impedance bias circuit and the high drive bias circuit.

15 Claims, 8 Drawing Sheets

(56) References Cited

U.S. PATENT DOCUMENTS

| | | | |
|---|---|---|---|
| 7,839,217 B2* | 11/2010 | Okuma | H03F 1/302 |
| | | | 330/296 |
| 7,944,293 B2 | 5/2011 | Lee et al. | |
| 8,026,767 B2 | 9/2011 | Chen et al. | |
| 8,217,716 B2 | 7/2012 | Tanaka et al. | |
| 8,552,803 B2 | 10/2013 | Sun et al. | |
| 9,634,619 B2* | 4/2017 | Gerard | H03F 1/56 |
| 2009/0146741 A1 | 6/2009 | Okuma | |
| 2015/0133186 A1 | 5/2015 | Banowetz et al. | |
| 2016/0094189 A1 | 3/2016 | Lyalin | |

OTHER PUBLICATIONS

Kim B., et al., "A Dual-Mode Power Amplifier with on-Chip Switch Bias Control Circuits for LTE Handsets", IEEE Transactions on Circuits and Systems—II: Express Briefs, vol. 58, No. 12, Dec. 2011, pp. 857-861.

* cited by examiner

FIG. 1

FIG. 2A
Intra-Band Carrier Aggregation on Contiguous Carriers

FIG. 2B
Intra-Band Carrier Aggregation on Non-Contiguous Carriers

FIG. 2C
Inter-Band Carrier Aggregation in Same Band Group

FIG. 2D
Inter-Band Carrier Aggregation in Different Band Groups

LOW IMPEDANCE ADAPTIVE BIAS SCHEME FOR POWER AMPLIFIER

CROSS-REFERENCE TO RELATED APPLICATION

The present application claims the benefit of U.S. Provisional Patent Application No. 62/456,958, filed on Feb. 9, 2017, and titled "LOW IMPEDANCE ADAPTIVE BIAS SCHEME FOR POWER AMPLIFIER," and U.S. Provisional Patent Application No. 62/414,580, filed on Oct. 28, 2016, and titled "LOW IMPEDANCE ADAPTIVE BIAS SCHEME FOR POWER AMPLIFIER," the disclosures of which are expressly incorporated by reference herein in their entireties.

BACKGROUND

Field

The present disclosure relates generally to wireless communication systems, and more specifically, adaptive bias scheme for a power amplifier (PA).

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. One or more of the transistors that are configured to amplify the communication signal are biased based on a number of different parameters and factors.

A bias circuit may be used to establish the parameters under which the communication signal is amplified. Correctly biasing the amplifiers is desirable so that the communication signal may be appropriately amplified and transmitted to support communication enhancements, such as carrier aggregation. The implementation of carrier aggregation in mobile RF transceivers enables a wireless carrier to increase available bandwidth by simultaneously using multiple frequencies for a single communication stream. While an increased amount of data is provided to the end user, successful implementation of carrier aggregation complicates biasing of amplifiers in the mobile RF transceiver.

SUMMARY

An adaptive bias circuit for a power amplifier may include a terminal node coupled to the power amplifier. The adaptive bias circuit may also include a low impedance bias circuit coupled to the terminal node. The adaptive bias circuit may further include a high drive bias circuit coupled to the low impedance bias circuit through the terminal node. A separation device may be arranged between the low impedance bias circuit and the high drive bias circuit.

A method of low impedance, adaptive biasing for a power amplifier (PA) may include receiving a radio frequency (RF) input signal at the power amplifier. The power amplifier may be configured to provide an output signal. The method may also include supplying a low current bias signal to the power amplifier when the RF input signal is at a first power level. The method may further include supplying a high drive current bias signal to the power amplifier when the RF input signal is at a second power level.

An adaptive bias circuit for a power amplifier may include means for receiving a radio frequency (RF) input signal at the power amplifier. The power amplifier may be configured to provide an output signal. The adaptive bias circuit may also include means for supplying a low current bias signal to the power amplifier when the RF input signal is at a first power level. The adaptive bias circuit may further include a means for supplying a high drive current bias signal to the power amplifier when the RF input signal is at a second power level.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

The detailed description set forth below in connection with the appended drawings is intended as a description of exemplary aspects of the present disclosure and is not intended to represent the only way it can be practiced. The term "exemplary" used throughout this description means "serving as an example, instance, or illustration," and should not necessarily be construed as preferred or advantageous over other exemplary aspects of the present disclosure. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

The detailed description includes specific details for the purpose of providing a thorough understanding of the exemplary aspects. It will be apparent to those skilled in the art that the exemplary aspects of the present disclosure may be practiced without these specific details. In some instances, well-known structures and devices are shown in block diagram form in order to avoid obscuring the novelty of the exemplary aspects presented herein. Other aspects, as well as features and advantages of various aspects, will become apparent to those of skill in the art through consideration of the ensuing description, the accompanying drawings and the appended claims.

Fabrication of mobile radio frequency (RF) chip designs (e.g., mobile RF transceivers) becomes complex at deep sub-micron process nodes due to cost and power consumption considerations. Further design challenges for mobile RF transceivers include analog/RF performance considerations, including mismatch, noise and other performance considerations. The design complexity of these mobile RF transceivers is further complicated by added circuit functions to support communication enhancements, such as carrier aggregation. The implementation of carrier aggregation in mobile RF transceivers enables a wireless carrier to maximize available bandwidth by simultaneously using multiple frequencies for a single communication stream. While an increased amount of bandwidth is provided to the end user, successful implementation of carrier aggregation complicates biasing of amplifiers in a mobile RF transceiver.

In a mobile RF transceiver, a communication signal is amplified and transmitted by a transmit section. The transmit section may include one or more circuits that amplify and transmit the communication signal. The amplifier circuits may include one or more amplifier stages that may have one or more driver stages and one or more power amplifier stages. Each of the amplifier stages may include one or more transistors configured in various ways to amplify the communication signal. One or more of the transistors configured to amplify the communication signal are biased based on a number of different parameters and factors.

A power amplifier may include one or more stages having, for example, driver stages, power amplifier stages, or other components, that can be configured to amplify a communication signal on one or more frequencies, in one or more frequency bands, and at one or more power levels. Depending on various factors, the power amplifier can be configured to operate using one or more bias signals.

A bias circuit may establish the parameters under which the communication signal is amplified by the power amplifier. Correctly biasing the power amplifier is desirable so that the communication signal may be appropriately amplified and transmitted to support communication enhancements, such as carrier aggregation. In particular, support for carrier aggregation involves power amplifier operation in both a high power range and a low power range. For example, a high current bias is specified to enhance linearity for the high power range. To achieve high efficiency over the desired power range, however, a low current bias is specified for the lower power range.

A two-diode based bias circuit may be incorporated into a power amplifier to provide one or more bias signals based on, for example, the desired amplification or output power level, the strength of the input signal, and other factors. Unfortunately, the two-diode based bias circuit may provide an undesirable high impedance at a low frequency associated with the low power range. The high impedance (e.g., 50 Ohms) generated by the two-diode based bias circuit at the low frequency of the low power range may be due to the lack of a feedback path within the two-diode bias circuit. The high impedance produced by the two-diode based bias circuit at the low frequency may cause a memory effect that degrades linearity for high speed data rate applications (e.g., modulation bandwidth, LTE 20 MHz or LTE 40 MHz) associated with carrier aggregation.

A memory effect generally refers to a change in non-linear characteristics of a power amplifier resulting from a past history of an input signal. Unfortunately, if non-linearity is introduced anywhere in a signal path, the signal may be irreconcilably corrupted by noise or improper encoding and decoding. Mitigation of the memory effect may be achieved by using a current mirror type bias circuit. A low impedance (e.g., 5 Ohms) is exhibited by the current mirror type bias circuit due to, for example, a feed-back path in the current mirror type bias circuit. Unfortunately, the current mirror type bias circuit fails to sustain a voltage at the high power range due to a negative feedback loop. While the negative feedback loop exhibits a low impedance, the negative feedback loop also discharges an output node during a first phase of an RF signal, which limits a boost-up mechanism of the power amplifier (e.g., a base emitter voltage (VBE)) for achieving the high power range.

For example, for higher modulation bandwidth waveforms, a memory effect from the bias circuit might be a dominant source of nonlinearity. The power amplifier output performance (e.g., amplitude modulation (AM)-amplitude modulation (AM-AM), amplitude modulation AM-phase modulation (AM-PM) output power and efficiency) now depends on the signal history due to the memory effect. That is, time in addition to instantaneous input power, affects the power amplifier output performance. In particular, if the power amplifier suffers from a memory effect, the output signal at a given time can depend not only on the present input value, but also previous output and input values. Common symptoms for power amplifiers with memory effects include power amplifier linearity (e.g., IM3 or ACLR) that changes as a function of the frequency difference between two stimulus tones (e.g., its IM3 (or ACLR) upper and lower sidebands exhibit asymmetry, or it produces hysteretic/multi-valued AM-AM and AM-PM amplifier responses in response to modulated signals). This asymmetry or hysteretic symptoms get worse when the modulated signal includes more bandwidth for high speed data rate applications. The memory effects are caused by a number of sources, including time-varying conditions such as selfheating, bias modulation, and matching components that vary at a relatively slow rate.

For a bias circuit, the low impedance at envelope signal frequency (modulation bandwidth), such as 40 MHz for LTE 40 with carrier aggregation, it is important to reduce the memory effect induced by bias modulation. Mitigation of the memory effect may be provided by using a current mirror type bias circuit. Unfortunately, a current mirror type bias circuit fails to sustain a voltage at the high power range. If the current mirror type bias circuit fails to sustain a bias voltage at the high power range, this results in poor AM-AM which directly hurts the linearity at a high power range regardless of high or low modulation bandwidth. That is why power amplifiers for a lower modulation bandwidth (e.g., global system for mobile communications (GSM)/code division multiple access (GSM/CDMA)) second generation (2G0 applications use a two-diode based bias circuit. Power amplifiers for higher modulation bandwidths, however, involve a solution for reducing the memory effect and providing improved linearity.

In aspects of the present disclosure, an adaptive bias circuit is described that combines the two-diode based bias circuit with the current mirror type bias circuit. In this arrangement, the adaptive bias circuit relies on a current mirror bias scheme to provide a low impedance path to the power amplifier for achieving a higher linearity. In addition, the adaptive bias circuit relies on a two-diode emitter follower scheme for sustaining a higher voltage bias at the higher power range. The adaptive bias circuit may be configured to provide a bias signal to the power amplifier based on the strength or power level of the radio frequency (RF) input signal. In this aspect of the present disclosure, the adaptive bias circuit effectively meets the conflicting demands of enhancing linearity for the high power range, achieving high efficiency over the desired power range by supplying a low current bias for the lower power range.

Figure 1:
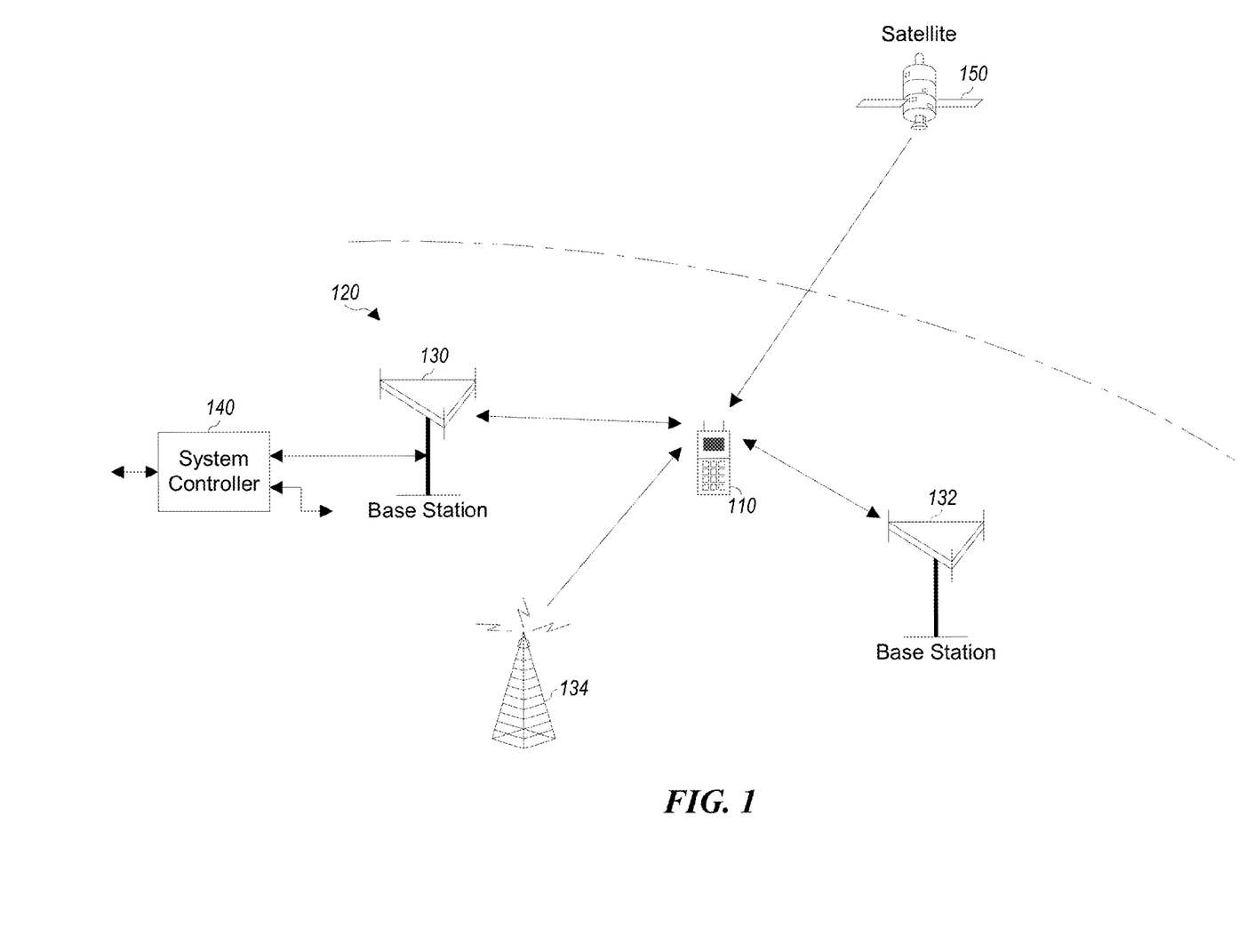
FIG. 1 shows a wireless device communicating with a wireless system, according to an aspect of the present disclosure.

FIG. 1 shows a wireless device 110 communicating with a wireless communication system 120. The wireless communication system 120 may be a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2A:
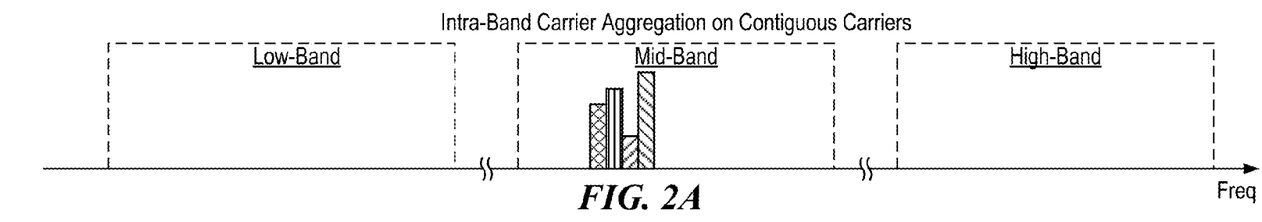
FIGS. 2A-2D show four examples of carrier aggregation (CA), according to aspects of the present disclosure.

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

Figure 2B:
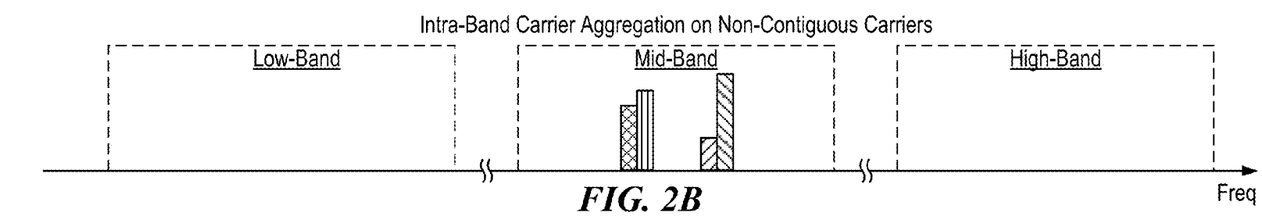

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

Figure 2C:
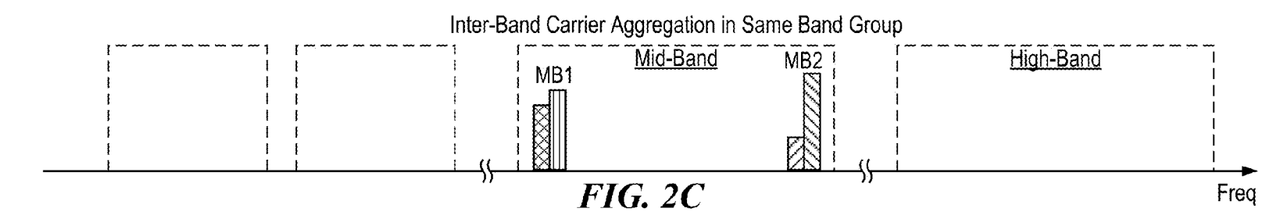

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

Figure 2D:
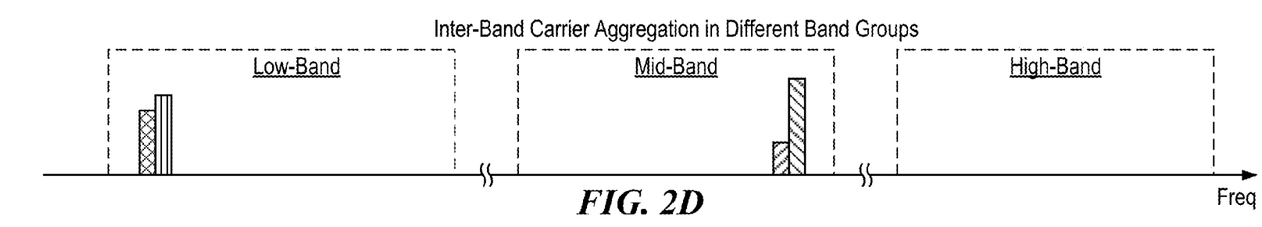

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicensed spectrum (LTE-U).

Figure 3:
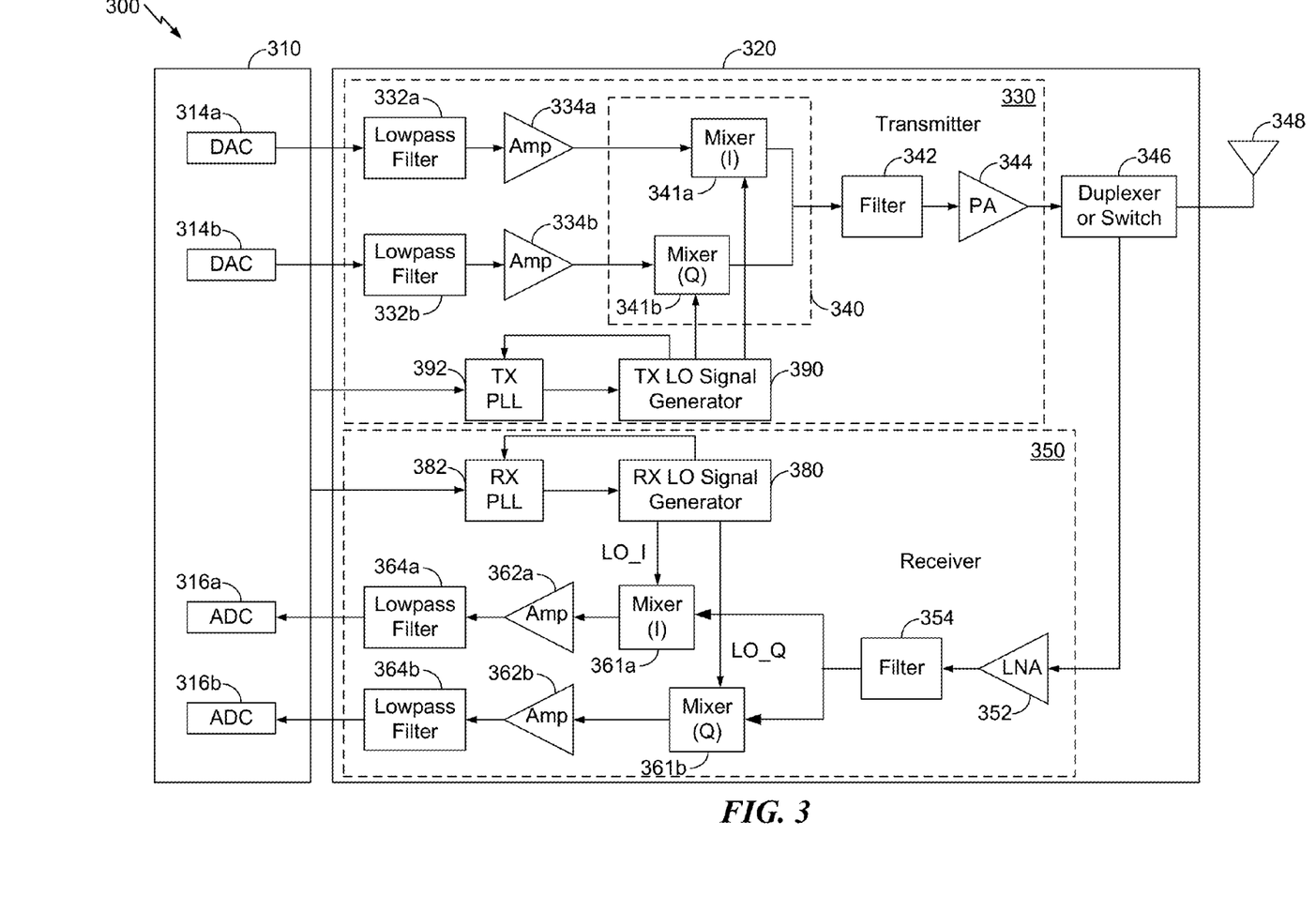
FIG. 3 shows a block diagram of the wireless device in FIG. 1, according to an aspect of the present disclosure.

FIG. 3 shows a block diagram of an exemplary design of a wireless device 300, such as the wireless device 110 shown in FIG. 1. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to reduce undesired images caused by the frequency upconversion as well as interference in a receive frequency band. A power amplifier (PA) 344 amplifies the signal from filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. Depending on various factors, the power amplifier can be configured to operate using one or more bias signals.

A bias circuit establishes parameters under which a communication signal is amplified by a power amplifier 344. Correctly biasing the power amplifier 344 is desirable so that the communication signal is appropriately amplified and transmitted to support communication enhancements, such as carrier aggregation. In particular, support for carrier aggregation involves power amplifier operation in both a high power range and a low power range. For example, a high current bias is specified to enhance linearity for the high power range. To achieve high efficiency over the desired power range, however, a low current bias is specified for the lower power range.

A two-diode based bias circuit may be incorporated into the power amplifier 344 to provide one or more bias signals based on, for example, the desired amplification or output power level, the strength of the input signal, and other factors. Unfortunately, the two-diode based bias circuit may provide an undesirable high impedance at a low frequency associated with the low power range. The high impedance produced by the two-diode based bias circuit at the low frequency causes a memory effect that degrades linearity for high speed data rate applications. Mitigation of the memory effect may be achieved with a current mirror type bias circuit. Unfortunately, a current mirror type bias circuit fails to sustain a voltage at the high power range.

In aspects of the present disclosure, an adaptive bias circuit is described that combines the two-diode based bias circuit with the current mirror type bias circuit. In this arrangement, the adaptive bias circuit relies on a current mirror bias scheme to provide a low impedance path to the power amplifier for achieving a higher linearity. In addition, the adaptive bias circuit relies on a two-diode emitter follower scheme for sustaining a higher voltage bias at the higher power range. The adaptive bias circuit may be configured to provide a bias signal to the power amplifier based on the strength or power level of the radio frequency (RF) input signal. In this aspect of the present disclosure, the adaptive bias circuit effectively meets the conflicting demands of enhancing linearity for the high power range, while achieving high efficiency over the desired power range by supplying a low current bias for the lower power range. Those skilled in the art, however, will recognize that aspects described may be implemented in transmit architectures that differ from the architecture illustrated in FIG. 3.

Figure 4:
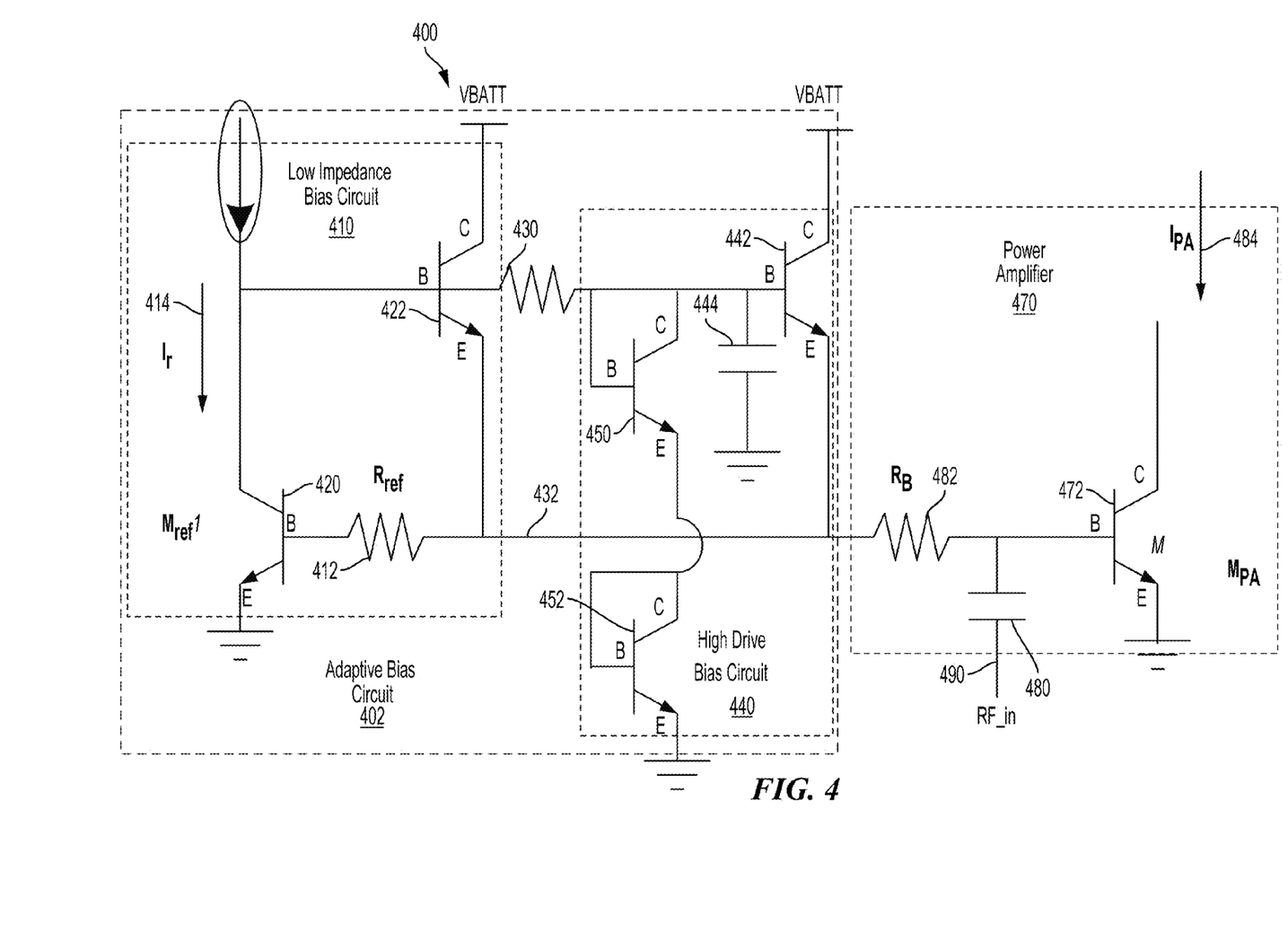
FIG. 4 is a schematic diagram illustrating an amplifier system including an adaptive bias circuit according to aspects of the present disclosure.

FIG. 4 is a schematic diagram illustrating an amplifier system 400 including an adaptive bias circuit 402 according to aspects of the present disclosure. As noted above, the amplifier system 400 may be incorporated into a power amplifier such as, for example, the power amplifier 344 shown in FIG. 3. The amplifier system 400 includes the adaptive bias circuit 402 operatively coupled to a power amplifier 470. The power amplifier 470, however, can be any of a variety of amplifiers or amplifier circuits, such as, for example, a driver amplifier, a main power amplifier, or any other amplifier that uses a bias signal to adjust at least some of its operation parameters.

According to this aspect of the present disclosure, the adaptive bias circuit 402 includes a low impedance bias circuit 410 and a high drive bias circuit 440, which are electrically coupled together through a separation device 430 (e.g., a separation resistor or inductor). The output of the adaptive bias circuit 402 is supplied to a control input of the power amplifier 470. The low impedance bias circuit 410 or the high drive bias circuit 440 drive the control input of an amplifier transistor 472 of the power amplifier 470 based on one or both of the input power level and the desired strength or power level of a desired transmit signal. Although shown as implemented using bipolar junction transistors (BJTs), if the amplifier transistor 472 is implemented as a field effect transistor (FET), then the output of the adaptive bias circuit 402 is provided to the gate of the amplifier transistor 472, rather than a base B of the amplifier transistor 472, as shown.

In operation, a radio frequency (RF) signal 490 is supplied from an input terminal RF_in, through a capacitor 480 to the base B of the amplifier transistor 472 and a base resistor 482 ($R_B$), coupled between a terminal node 432 and the base B of the amplifier transistor 472. In an exemplary configuration, the capacitor 480 can be a direct current (DC) blocking capacitor configured to prevent a DC signal on a base terminal of the amplifier transistor 472 from appearing at the input terminal RF_in. For example, the RF signal 490 may be a modulated long term evolution (LTE) signal having a bandwidth of, for example, approximately 10 MHz to approximately 40 MHz.

In an aspect of the present disclosure, the adaptive bias circuit 402 supplies a range of bias voltages based on at least one of the input power level and the desired strength or power level of a desired transmit signal. For example, at low power levels, the adaptive bias circuit 402 provides a low level bias signal and also provides a low input impedance path between the low impedance bias circuit 410 and the power amplifier 470. When the input power level increases, the high drive bias circuit starts to work. The voltage between the base and the emitter of emitter-follower transistor 442 increases to a predetermined value sufficient for supplying additional current through the emitter-follower transistor 442 from Vsupply because the RF voltage signal at base of the emitter-follower transistor 442 is decoupled to the emitter of emitter-follower transistor 442 thanks to the decoupling capacitor 444. At higher power levels, the high drive bias circuit 440 of the adaptive bias circuit 402 supplies a high drive current to the amplifier transistor 472, while the low impedance bias circuit still provides a low input impedance path to the amplifier transistor 472. The low impedance bias circuit 410 can be any bias circuitry that can supply a bias signal to the amplifier transistor 472, while providing a low input impedance at an envelop frequency of the RF signal 490. The term bias signal may include a voltage, a current, or a combination of voltage and current.

Representatively, the low impedance bias circuit 410 includes a reference transistor 420, having a base B coupled to a reference resistor 412 ($R_{ref}$), with the reference resistor 412 coupled to a terminal node 432. The low impedance bias circuit 410 also includes a current mirror transistor 422, having a base B coupled to a collector C of the reference transistor 420, a collector C coupled to a power rail (Vsupply), and an emitter E coupled to the terminal node 432. In operation, a reference current ($I_r$) 414 is received by the collector C of the reference transistor 420 and a base of the current mirror transistor 422 (CM transistor). Operation of the low impedance bias circuit 410 to supply a low current bias for a low power range of the RF signal 490 is described with respect to FIG. 5.

Figure 5:
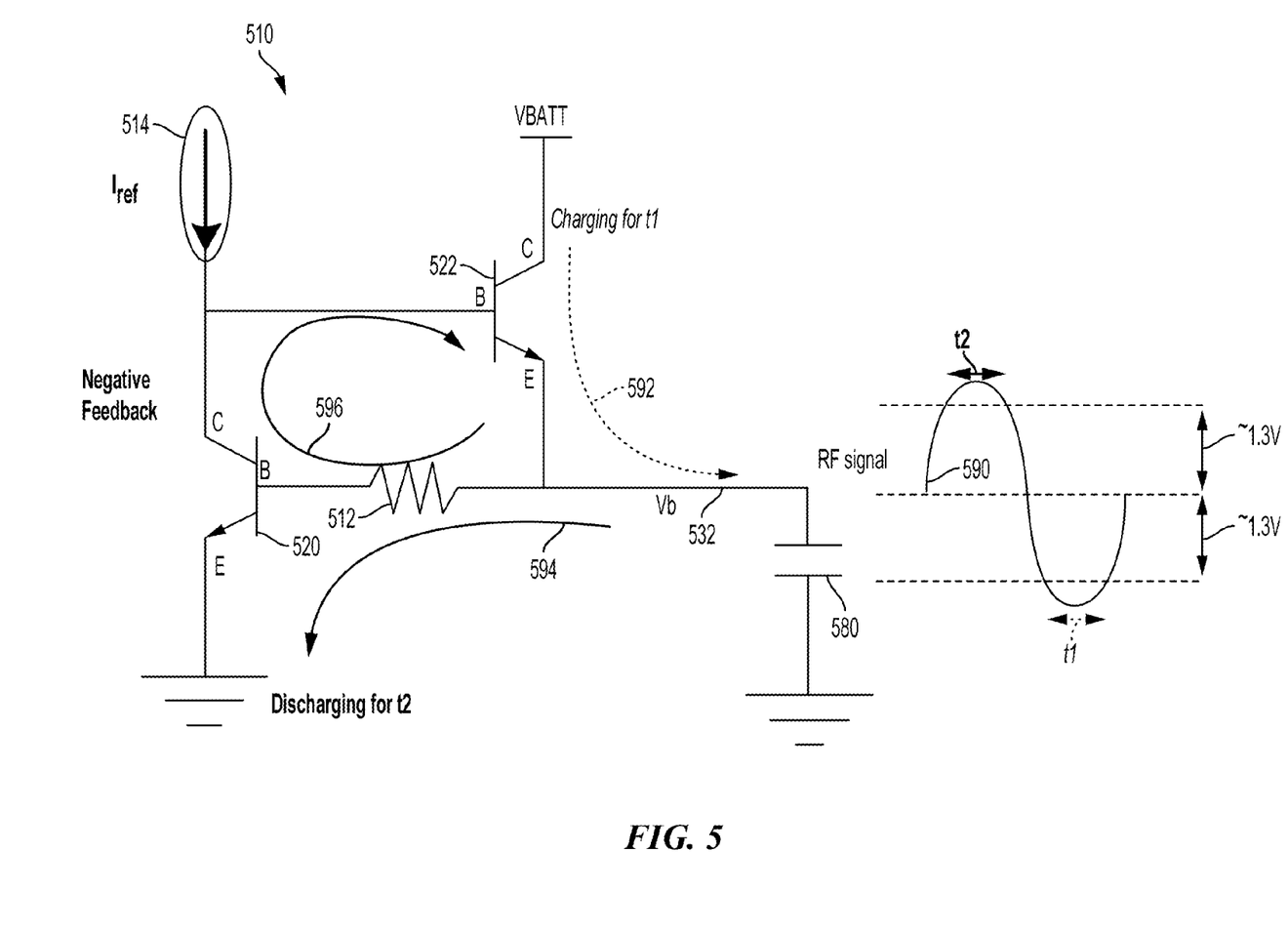
FIG. 5 illustrates operation of the low impedance bias circuit of FIG. 4, in a current mirror bias circuit configuration, according to aspects of the present disclosure.

FIG. 5 illustrates operation of the low impedance bias circuit 410 of FIG. 4, as a current mirror bias circuit 510, according to aspects of the present disclosure. Representatively, the current mirror bias circuit 510 also includes the reference transistor 520, having a base B coupled to a reference resistor 512, with the reference resistor 512 coupled to a terminal node 532. The current mirror bias circuit 510 also includes a current mirror (CM) transistor 522, having a base B coupled to a collector C of the reference transistor 520, a collector C coupled to the power rail Vsupply, and an emitter E coupled to the terminal node 532. In this arrangement, a reference current 514 ($I_{ref}$) is received by the collector C of the reference transistor 520 and the base B of the CM transistor 522.

The amplifier transistor 472 can be modeled as a capacitor to explain how current mirror bias circuit works. In FIG. 5, a capacitor 580 represents the amplifier transistor 472 (FIG. 4). A RF signal 590 represents the signal applied at the base of the amplifier transistor 472. In operation, the capacitor 580 is charged during a first period t2 of an RF signal 590, while the capacitor 580 is discharged during a second period t1 of the RF signal 590. A voltage of the terminal node 532, which is charged or discharged depending on the period of the RF signal 590, is shown as a base voltage (Vb). According to this aspect of the present disclosure, the CM transistor 522 supplies a low impedance, as seen from a base of the amplifier transistor 472 (FIG. 4), due to a negative feedback loop 596 caused by a discharge path 594 during the first period t2 of the RF signal 590. During the second period t1 of the RF signal 590, a charging path 592 is provided, with a discharge path simultaneously provided for the second period t1 as negative feedback.

As seen from the capacitor 580 (i.e., seen from the base B of the amplifier transistor 472 (FIG. 4)), the negative feedback loop 596 supplies the current mirror bias circuit 510 with a low impedance. As a result, at low power levels, the current mirror bias circuit 510 supplies a low level bias signal and also provides a low input impedance path on the terminal node 532, coupled to a capacitor 580.

Referring again to FIG. 4, the high drive bias circuit 440 includes a first diode-connected transistor 450 and a second diode-connected transistor 452. In this arrangement, a base B and a collector C of the second diode-connected transistor 452 are electrically coupled to an emitter E of the first diode-connected transistor 450. A base B and a collector C of the first diode-connected transistor 450 are electrically coupled to a base B of an emitter-follower transistor 442. The collector C of the first diode-connected transistor 450 is also coupled to the power rail Vsupply through the emitter-follower transistor 442 (EF transistor), and the emitter E of the first diode-connected transistor 450 is electrically coupled to ground.

In this arrangement, a decoupling capacitor 444 is coupled to the base B of the emitter-follower transistor 442. The decoupling capacitor 444 can decouple the RF signal at the base B of the emitter-follower transistor 442 from the emitter E of the emitter-follower transistor 442. The reference current ($I_r$) 414 is also received by the collector C of the first diode-connected transistor 450 and a base of the emitter-follower transistor 442 through a separation device 430. As a result, the high drive bias can be supplied by the emitter-follower transistor 442. Operation of the high drive bias circuit 440 is further described with respect to FIG. 6.

Figure 6:
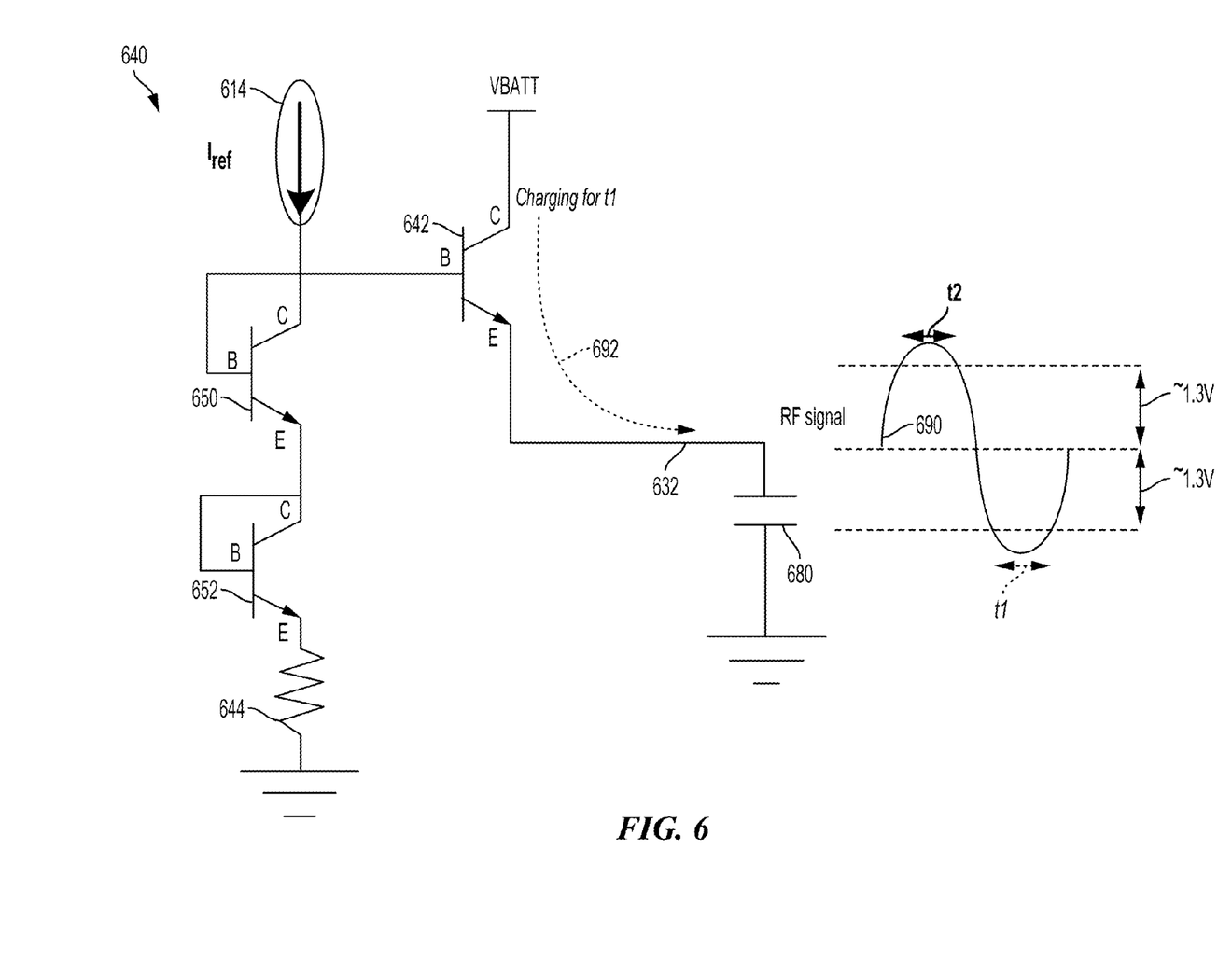
FIG. 6 illustrates operation of the high drive bias circuit of FIG. 4, in an emitter-follower bias circuit configuration, according to aspects of the present disclosure.

FIG. 6 illustrates operation of the high drive bias circuit 440 of FIG. 4, as an emitter-follower bias circuit 640, according to aspects of the present disclosure. The emitter-follower bias circuit 640 provides a high impedance (e.g., 50 ohms) due to the lack of a feedback path, such as the feedback path provided by the terminal node 432 in the low impedance bias circuit 410 of FIG. 4. At a high frequency range of an RF signal 690 (e.g., at a carrier frequency range), the emitter-follower bias circuit 640 supplies a high current bias to the power amplifier 470 (FIG. 4), which enhances linearity for the high power range. At the modulation bandwidth frequency (e.g., LTE 20 MHz or LTE 40 MHz), the emitter-follower bias circuit 640 exhibits a high impedance. This high impedance causes an increased memory effect. Mitigation of the memory effect results from using an adaptive bias scheme that combines the current mirror bias circuit 510 (FIG. 5) with the emitter-follower bias circuit 640.

Representatively, the emitter-follower bias circuit 640 also includes a first diode-connected transistor 650 and a second diode-connected transistor 652. A base B and a collector C of the second diode-connected transistor 652 are electrically coupled to an emitter E of the first diode-connected transistor 650. In addition, a base B of the first diode-connected transistor 650 is electrically coupled to a base B of an emitter-follower transistor 642 (EF transistor). An emitter E of the second diode-connected transistor 652 is electrically coupled to a resistor 644 that is electrically coupled to ground. The resistor 644 can be omitted. In addition, an emitter E of the emitter-follower transistor 642 is electrically coupled to a terminal node 632.

The amplifier transistor 472 can be modeled as a capacitor to explain how emitter-follower bias circuit 640 works. In FIG. 6, A capacitor 680 represents the amplifier transistor 472 (FIG. 4). A RF signal 690 represents the signal applied at the base of the amplifier transistor 472. In operation, the terminal node 632 of the emitter-follower bias circuit 640 is charged during a second period t1 of the RF signal 690. That is, a bias provided by an emitter-follower transistor 642 supplies a current to a capacitor 680 during the second period t1 of the RF signal 690. Although the RF signal 690 is below a DC voltage level (e.g., up to 1.3 volts) during the second period t1, the bias from the emitter-follower transistor 642 provides a charging path 692 that supplies a current to a capacitor 680. During the first period t2 of the RF signal 690, there is no path to discharge the capacitor 680 so that a base-emitter voltage (VBE) bias on the terminal node 632 will boost-up as the output power increases during the high power range of the RF signal 690.

During high power range operation, the RF signal 690 appears at the terminal node 632 to activate the emitter-follower transistor 642 for supplying the charging path 692. In addition, using the decoupling capacitor 444, an RF signal at the base of the emitter-follower transistor 642 may be decoupled by the reference current (Iref) 614 to a predetermined value (e.g., 2.6 volts) to get the base-emitter voltage high enough to supply sufficient current for the terminal node 632. During high power range operation, the voltage difference between the base B and the emitter E of the emitter-follower transistor 642 (VBE) supplies a VBE bias for boosting an amplifier transistor 472 (FIG. 4) as the output power of the RF signal 690 increases based on a power amplifier current ($I_{PA}$) 484. By contrast, during low power range operation, the charging path 692 is substantially reduced, which limits the VBE bias from boosting the amplifier transistor 472.

Referring again to FIG. 4, the adaptive bias circuit 402 can provide a range of bias voltages and bias currents based on the input power level of the RF signal 490 at the input terminal RF_in and the desired strength or power level of a desired transmit signal. For example, at low power levels, the adaptive bias circuit 402 provides a low level bias signal and also provides a low input impedance path on the terminal node 432 to the amplifier transistor 472. At low power levels the negative feedback path (e.g., 596) discharges the terminal node 432 so that a low current bias (e.g., a base emitter voltage (VBE) bias) is supplied to the amplifier transistor 472 during the low power range. By contrast, during the high power range, a charging path (e.g., 692) to the terminal node 432 creates the voltage difference between the base B and the emitter E of the emitter-follower transistor 642 (VBE), which generates a high drive current for boosting the amplifier transistor 472 as the output power of the RF signal 690 increases.

In an aspect of the present disclosure, a maximum linear power output for an LTE transmitter, such as the power amplifier 470, may be approximately 29 dBm and a maximum instantaneous power output for an LTE transmitter may be approximately 33 dBm. In an exemplary aspect, the term "high power" may comprise approximately 23 dBm to approximately 33 dBm or higher. Different operating standards may have different power levels. The term "low power" may comprise approximately less than 23 dBm, and the terms "high power" and "low power" may refer to power levels that are relative to each other.

Figure 7:
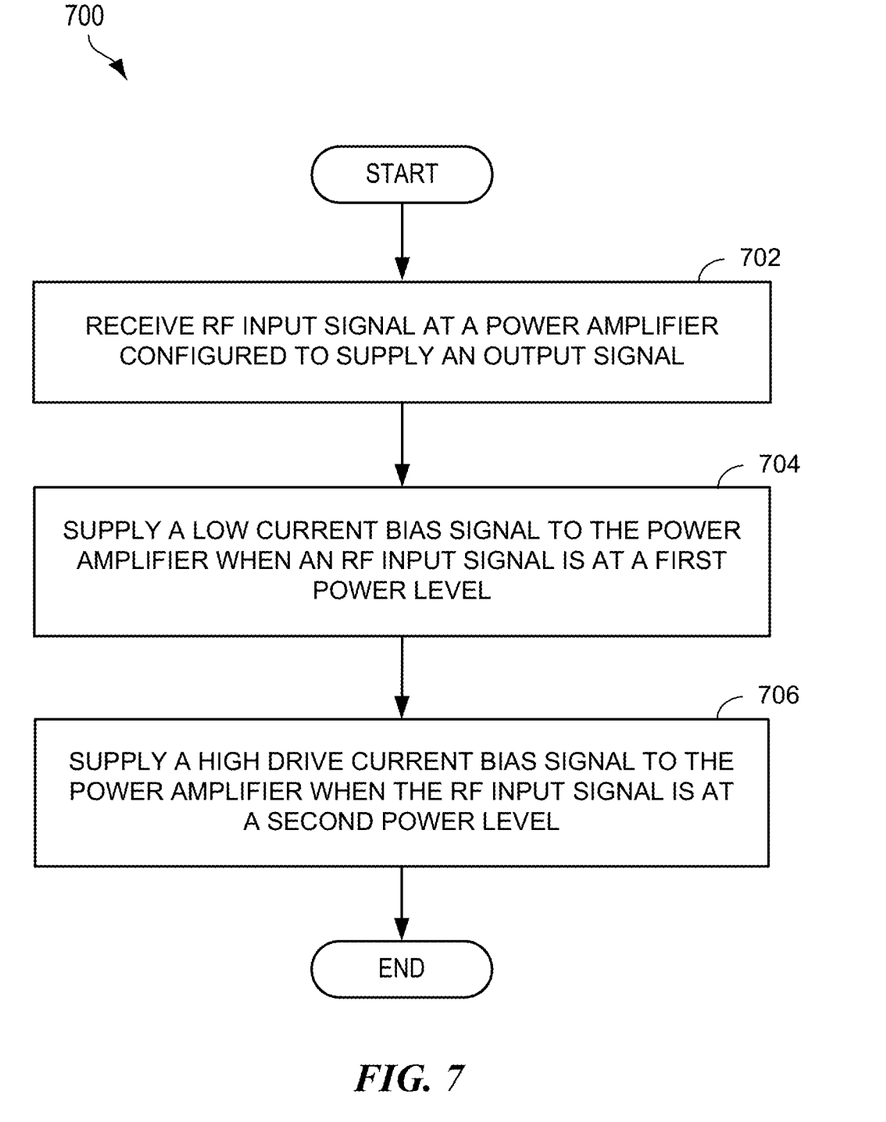
FIG. 7 is a flow diagram illustrating a method of a low impedance, adaptive bias scheme for a power amplifier (PA), in accordance with aspects of the present disclosure.

FIG. 7 is a flow diagram illustrating a method 700 for low impedance, adaptive biasing for a power amplifier (PA), in accordance with aspects of the present disclosure. The blocks in the method 700 can be performed in or out of the order shown, and in some aspects, can be performed at least in part in parallel.

At block 702, a radio frequency (RF) input signal is received at a power amplifier configured to supply an output signal. For example, as shown in FIG. 4, the RF signal 490 is received at the input terminal RF_in of the amplifier system 400. At block 704, a low current bias signal is supplied to the power amplifier when the RF signal is input at a first power level. For example, as shown in FIGS. 4 and 5, negative feedback caused by the negative feedback loop 596 limits a boost-up mechanism for a base emitter voltage (VBE) of the amplifier transistor 472 by preventing activation of the amplifier transistor 472. As a result, the current mirror bias circuit 510 supplies a low level bias signal at low power levels, and also provides a low input impedance path to the power amplifier 470 regardless of power level. This inventive aspect includes supplying the low impedance path and a reduced drive current to the power amplifier in addition to the low current bias signal.

Referring again to FIG. 7, at block 706, a high drive current bias signal is supplied to the power amplifier when the RF input signal is at a second power level (e.g., RF input signal meets or exceeds a power threshold). For example, as shown in FIG. 4, at higher power levels, the high drive bias circuit 440 of the adaptive bias circuit 402 supplies a bias voltage and a high drive current to the amplifier transistor 472, while also providing a low input impedance path to the amplifier transistor 472. As shown in FIG. 6, during high power range operation, the voltage difference between the base B and the emitter E of the emitter-follower transistor 642 (VBE) supplies a VBE bias for boosting the amplifier transistor 472 as the output power of the RF signal 690 increases. This inventive aspect includes supplying an increased base emitter voltage (VBE) and an increased current in addition to supplying the high drive current bias signal. By contrast, during low power range operation, the charging path 692 is substantially reduced, which limits the VBE bias from boosting the amplifier transistor 472. That is, in the adaptive bias circuit 402, a bias signal is generated based on a power level. In an exemplary configuration, the bias signal may be generated based on the level of an input signal, or based on a desired power output level of an amplifier.

The adaptive bias circuit can be configured to provide high bias current to enhance linearity of an amplifier for high power range operation, and can also be configured to provide low bias current for lower power range operation, to achieve high efficiency over a desired power range. At all power ranges, the adaptive bias circuit also provides low input impedance, which can improve data rate transmission, particularly at low input frequencies. The configurations of the adaptive bias circuit can be set to enable low input impedance at low frequencies as well as to provide high bias current at high power ranges, thereby providing a low input impedance at low frequencies for all power levels, and/or providing an increased bias voltage to enable sufficient current supply for high power ranges.

According to a further aspect of the present disclosure, a low impedance, adaptive bias circuit for a power amplifier (PA) is described. The adaptive bias circuit includes means for receiving a radio frequency (RF) input signal at the power amplifier, the amplifier configured to provide an output signal. The means for receiving may, for example, include the input terminal RF_in, as shown in FIG. 4. The adaptive bias circuit may also include means for supplying a low current bias signal to the power amplifier when the RF input signal is at a first power level. The supplying means may, for example, include the low impedance bias circuit 410 of FIG. 4 or the current mirror bias circuit 510 of FIG. 5. The adaptive bias circuit may further include means for supplying a high drive current bias signal to the power amplifier when the RF input signal is at a second power level. The means for supplying a high drive current bias signal may, for example, include the high drive bias circuit 440 as shown in FIG. 4 or the emitter-follower bias circuit 640 shown in FIG. 6. In another aspect, the aforementioned means may be any layer, module, or any apparatus configured to perform the functions recited by the aforementioned means.

Figure 8:
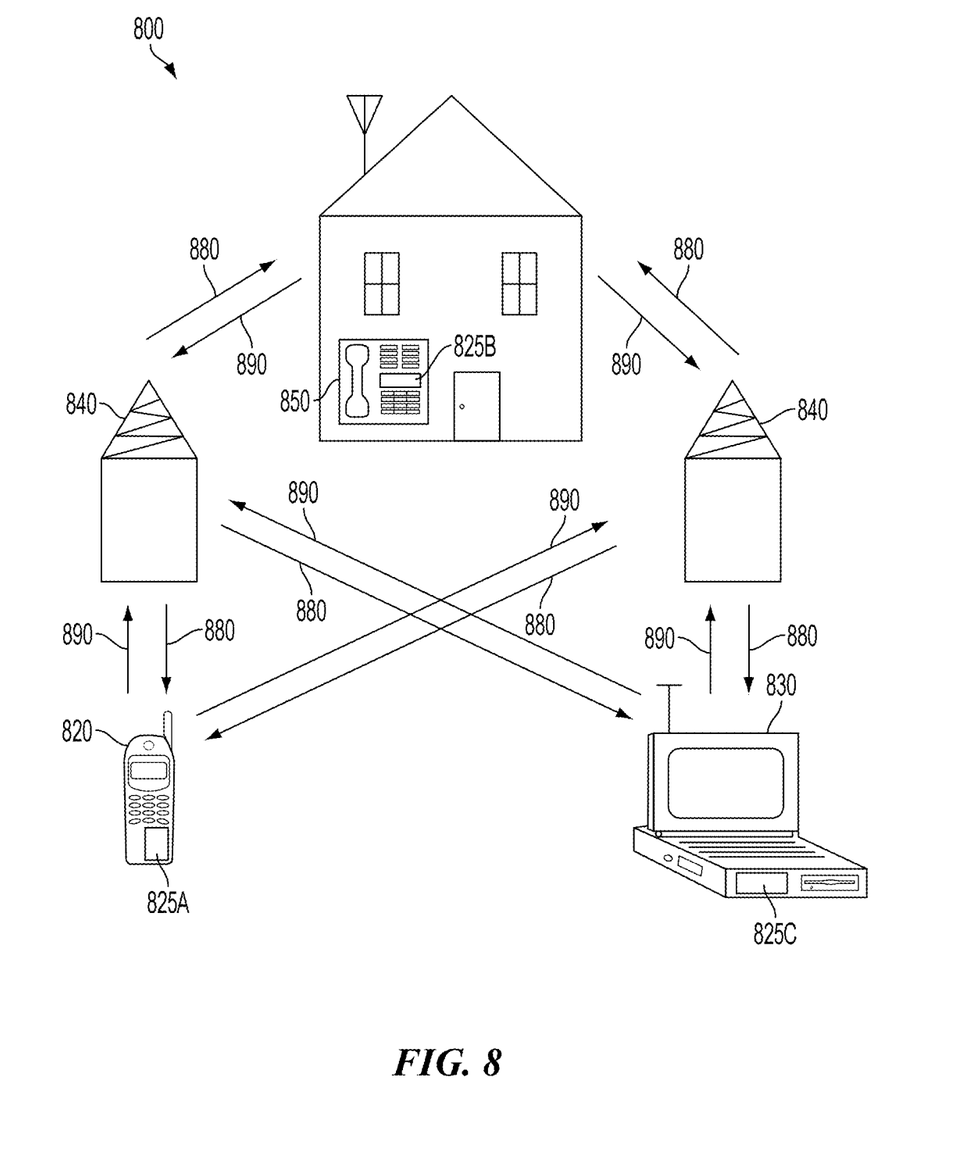
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed adaptive bias circuit. It will be recognized that other devices may also include the disclosed adaptive bias circuit, such as the base stations, user equipment, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed adaptive bias circuit.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. An adaptive bias circuit for a power amplifier, comprising:
    a terminal node coupled to the power amplifier;
    a low impedance bias circuit coupled to the terminal node; and
    a high drive bias circuit coupled to the low impedance bias circuit through the terminal node, in which the high drive bias circuit comprises:
        an emitter-follower transistor, having a base electrically coupled to a base and a collector of a first diode-connected transistor, and an emitter of the emitter-follower transistor electrically coupled to the terminal node;
        a second diode-connected transistor, having a base and a collector electrically coupled to an emitter of the first diode-connected transistor; and
        a decoupling capacitor electrically coupled to the base of the emitter-follower transistor and the base and the collector of the first diode-connected transistor.

2. The adaptive bias circuit of claim 1, further comprising a separation device between the low impedance bias circuit and the high drive bias circuit.

3. The adaptive bias circuit of claim 2, in which the separation device comprises a resistor or an inductor.

4. The adaptive bias circuit of claim 1, in which the low impedance bias circuit comprises:
    a reference transistor, having a base coupled to a reference resistor, in which the reference resistor is coupled to the terminal node; and
    a current mirror transistor, having a base coupled to a collector of the reference transistor, the collector of the current mirror transistor coupled to a power rail, and an emitter of the current mirror transistor coupled to the terminal node.

5. The adaptive bias circuit of claim 1, in which the low impedance bias circuit comprises a current mirror bias circuit to supply a low impedance path to a control input of the power amplifier.

6. The adaptive bias circuit of claim 1, in which the high drive bias circuit comprises an emitter-follower bias circuit configured to supply a high drive current to a control input of the power amplifier.

7. The adaptive bias circuit of claim 1, in which the low impedance bias circuit and the high drive bias circuit are coupled in parallel.

8. The adaptive bias circuit of claim 1, in which the adaptive bias circuit for the power amplifier is integrated into a wireless transceiver.

9. A method of low impedance, adaptive biasing for a power amplifier (PA), comprising:

receiving a radio frequency (RF) input signal at the power amplifier, the power amplifier configured to provide an output signal;

supplying a low current bias signal to the power amplifier when the RF input signal is at a low power range; and supplying a high drive current bias signal to the power amplifier when the RF input signal is at a high power range by supplying an increased base emitter voltage (VBE) to a transistor and an increased current based on an input power of the RF input signal coupled to an emitter of the transistor to a control input of the power amplifier.

10. The method of claim 9, further comprising supplying the high drive current bias signal to the power amplifier when the input power of the RF input signal is equal to or exceeds a power threshold.

11. The method of claim 9, in which supplying the low current bias signal further comprises supplying a low impedance path and a reduced drive current to the power amplifier in addition to the low current bias signal.

12. The method of claim 9, further comprising integrating the power amplifier into a wireless transceiver, the wireless transceiver incorporated into at least one of a music player, a video player, an entertainment unit, a navigation device, a communications device, a personal digital assistant (PDA), a fixed location data unit, a mobile phone, and a portable computer.

13. An adaptive bias circuit for a power amplifier, comprising:

means for receiving a radio frequency (RF) input signal at the power amplifier, the power amplifier configured to provide an output signal;

means for supplying a low current bias signal to the power amplifier when the RF input signal is at a low power range; and means for supplying a high drive current bias signal to the power amplifier when the RF input signal is at a high power range by supplying an increased base emitter voltage (VBE) of a transistor and an increased current based on an input power level of the RF input signal coupled to an emitter of the transistor to a control input of the power amplifier.

14. The adaptive bias circuit of claim 13, further comprising means for supplying the high drive current bias signal to the power amplifier when the input power of the RF input signal is equal to or exceeds a power threshold.

15. The adaptive bias circuit of claim 13, in which the means for supplying the low current bias signal further comprises means for supplying a low impedance path and a reduced drive current to the power amplifier in addition to the low current bias signal.

* * * * *